(12) United States Patent
Garcia

(10) Patent No.: US 7,839,138 B2
(45) Date of Patent: Nov. 23, 2010

(54) ADJUSTABLE FORCE ELECTRICAL CONTACTOR

(75) Inventor: Doug J. Garcia, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 636 days.

(21) Appl. No.: 11/740,480

(22) Filed: Apr. 26, 2007

(65) Prior Publication Data

US 2008/0180117 A1 Jul. 31, 2008

Related U.S. Application Data

(60) Provisional application No. 60/887,076, filed on Jan. 29, 2007.

(51) Int. Cl.
*G01R 31/28* (2006.01)
(52) U.S. Cl. .................................. 324/158.1
(58) Field of Classification Search ......... 324/754–765, 324/158.1
See application file for complete search history.

(56) References Cited

U.S. PATENT DOCUMENTS

| | | | | |
|---|---|---|---|---|
| 3,915,850 A * | 10/1975 | Crownover | ................ | 209/560 |
| 4,959,609 A | 9/1990 | Prokopp et al. | | |
| 5,034,749 A * | 7/1991 | Jungblut et al. | ............ | 324/758 |
| 5,718,040 A | 2/1998 | Faure et al. | | |
| 6,064,195 A * | 5/2000 | Clayton et al. | ........... | 324/158.1 |
| 6,100,707 A * | 8/2000 | Baumann et al. | ............ | 324/761 |
| 6,302,680 B1 * | 10/2001 | Gellert et al. | ............... | 425/549 |
| 6,515,498 B1 * | 2/2003 | Kobayashi et al. | .......... | 324/757 |
| 6,714,028 B2 * | 3/2004 | Garcia et al. | ................ | 324/754 |
| 7,091,733 B2 * | 8/2006 | Takekoshi et al. | ........... | 324/760 |
| 7,091,738 B2 * | 8/2006 | Nakano et al. | .............. | 324/770 |
| 7,443,179 B2 * | 10/2008 | Kosmowski | ................. | 324/754 |
| 2004/0113643 A1 * | 6/2004 | Kawaguchi et al. | ......... | 324/754 |
| 2005/0088198 A1 * | 4/2005 | Nakano et al. | .............. | 324/770 |

FOREIGN PATENT DOCUMENTS

| JP | 08-292228 | 11/1996 |
|---|---|---|
| JP | 08-334547 | 12/1996 |
| JP | 14-008804 | 1/2002 |

\* cited by examiner

*Primary Examiner*—Ha Tran T Nguyen
*Assistant Examiner*—Arleen M Vazquez
(74) *Attorney, Agent, or Firm*—Young Basile

(57) ABSTRACT

An apparatus for testing electric components supported on a test plate for transport along a of travel path through a test station includes an electrical contactor at the station for contacting the plate surface and at least one electronic component transported to the test station by the test plate for testing. An adjustable force applicator supplies contact pressure to the contactor to apply a substantially constant force over a large working travel range. The applicator can include an air cylinder having a force applying pin applying force to a position located between a working point of the contactor and the pivot point such that the applied force variation is reduced as a result of a lever reduction ratio between the working point and the pin position.

20 Claims, 7 Drawing Sheets

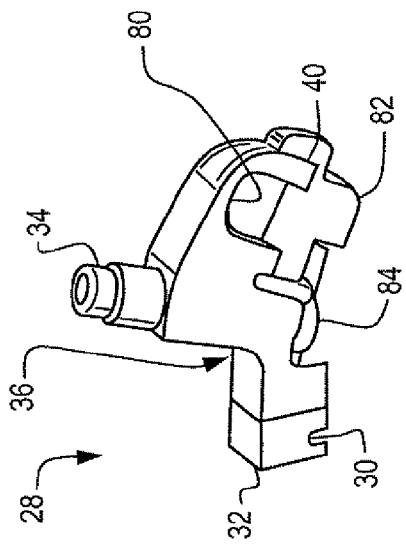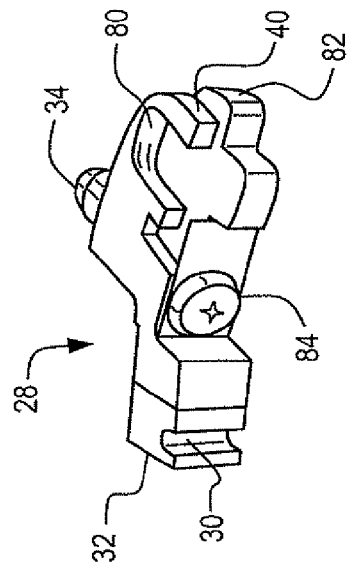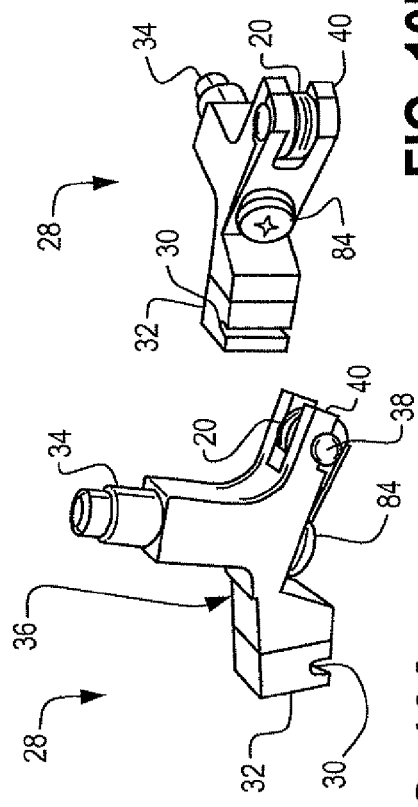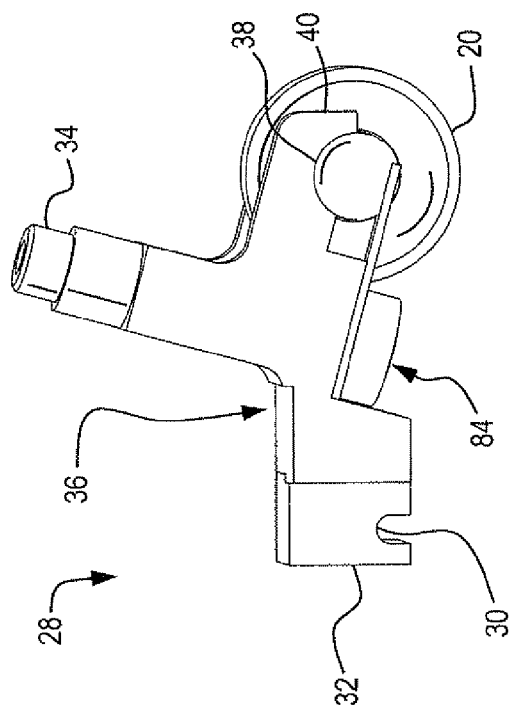

ADJUSTABLE FORCE ELECTRICAL CONTACTOR

REFERENCE TO RELATED APPLICATIONS

This application claims the benefit under 35 U.S.C. §119 (e) of U.S. Provisional Application Ser. No. 60/887,076 filed on Jan. 29, 2007, which is incorporated by reference herein in its entirety, and is related to U.S. patent application Ser. No. 11/565,406 filed on Nov. 30, 2006, which is incorporated by reference herein in its entirety.

FIELD OF THE INVENTION

The invention relates to the field of testing equipment for electronic components, and more particularly, to the field of an electrical contactor that engages a termination surface or an area of a device under test while making electrical contact therewith.

BACKGROUND

In the field of miniature electronic devices there are miniature components having conductive end terminations that require testing to assure the quality of the electronic capabilities. One type of contactor used to temporarily connect to the conductive ends of the electronic devices for the purpose of electrical measurements includes a contact roller, either standard size or micro size. Other types of contactors include sliding contact tips, sometimes referred to a blade, a disc or a wire tip. The various contactor module types can be used for testing the particular electronic components and are selected depending on the operating conditions such as: high contact pressure-high electrical power measurement; high contact pressure-low electrical power measurement; low contact pressure-high electrical power measurement; or low contact pressure-low electrical power measurement.

The various contact module types can be made of an electrically conductive metal material. The contact roller type is rotatable on an axis secured to a base plate or frame work of the testing machine via a spring support. The spring support may vary in length and include springs that continually bias or urge the support to the maximum length. Presently, the contact roller is preloaded to a constant spring force. As the test plate moves, the spring support urges the roller toward the path surface whereby the roller rolls on or at the same time presses on the surface of the test pad. As an electrical component moves to the test area via a test plate, the roller rolls off the path surface and on to the end of the electronic component to be tested. Once the roller is fully pressed into the component, the part is ready for testing. The downward force exerted by the roller on the component during testing is the same predetermined force exerted on the surface of the test path as the test plate moves. The required contact force to make a proper test measurement on an electronic component is about 50 grams. However, as the components to be processed get smaller, the resilience of the metal termination of the components diminishes to a point where the allowable contact load drops below the required load for stable testing. The maximum allowable force for the smaller electronic components during motion is only about 20 grams. Therefore, additional force placed on a moving electronic component can cause damage to the component.

Another procedure to eliminate damage to the electronic component includes activating the contact roller so that the roller does not touch the surface of the test plate or the electronic component while the test place is in motion. This procedure requires the contact roller to be retracted from the test plate and component while the test plate is in motion and then extended when the test plate stops and the component is in place for testing. In this procedure, the contact roller is actuated by a solenoid coil. When the solenoid coil is de-energized, the contact roller is in a raised position above the test plate. Once the test plate stops and an electronic component is in place at the test station for testing, the solenoid coil energizes and lowers the contact roller. The contact roller is preloaded to a 50 gram vertical force on the electronic component to allow for a stable testing environment. The disadvantage of this procedure is that the raising and lowering of the contact roller causes 5% to 13% decrease in productivity of the testing system.

Currently, the upper electrical contacts for electrical measurement of the miniature electronic component include a cantilever arm that will increase the contact force on the component as the deflection of the cantilever spring arm is increased. Multiple contacts are used at each test station, and the contacts are co-planarized in order to produce roughly the same contact force at a given deflection setting. Alternatively, compression springs are sometimes used to provide the contact or down-force. Additionally, flat spring fingers are sometimes used to produce the force needed. If it is desired to change the nominal force value, the spring force source must be changed out, or the position of the contactor must be changed with respect to the device under test in order to increase or decrease the compression of the spring force source in order to increase or decrease the force output. The spring force sources will also fatigue over time and require replacement.

SUMMARY

It would be desirable to reduce or eliminate the time required in the prior known devices to co-planarize the contactors. It would be desirable to accurately control the actual contact force versus only matching the deflections of unique contacts and expecting the contact forces to be identical. It would be desirable to change the contact force dynamically without the need to change any hardware. It would be desirable to automate the contact force adjustment in real-time based on test results for various lots of devices under test. It would desirable to reduce or eliminate lateral change of the contact or apex with respect to the device under test. It would be desirable to simplify or eliminate the recalibrating of the contact height due to normal wear of the consumable pieces. It would be desirable to reduce the cost of the contact component by allowing lower tolerance parts to work within the system.

An apparatus for testing electronic components supported on a test plate for transport along a path of travel through a test station includes an electrical contactor located at the test station for contacting a surface of the test plate and at least one component transported to the test station by the test plate for testing, and an adjustable force applicator for supplying contact pressure to the contact arm. The applicator is connected to the contactor to in order to supply a substantially constant force over a large working range of travel. In one embodiment of the invention, the electrical contactor can be selected from a group of contactor tips consisting of a sliding contact, a large radius contact, a small radius contact, a micro roller, a standard roller, a sliding blade, a disk, and wire. In another embodiment of the invention, the adjustable force applicator can be selected from a group of force applicators consisting of an air cylinder, a bladder cylinder, a pneumatic bladder, an electroformed bellows, a voice coil motor, a solenoid, a piezoelectric actuator, and a muscle wire beam.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein:

FIG. 9 is a perspective view of a standard roller style contactor;

FIGS. 10A and 10B are perspective views of a micro roller style contactor;

FIGS. 11A and 11B are perspective views of an indexable X-shape tip style contactor, a bracket having a complementary tip receiving aperture, and a fastener for releasably holding the indexable tip in a fixed position with respect to the bracket.

DETAILED DESCRIPTION

Figure 1:
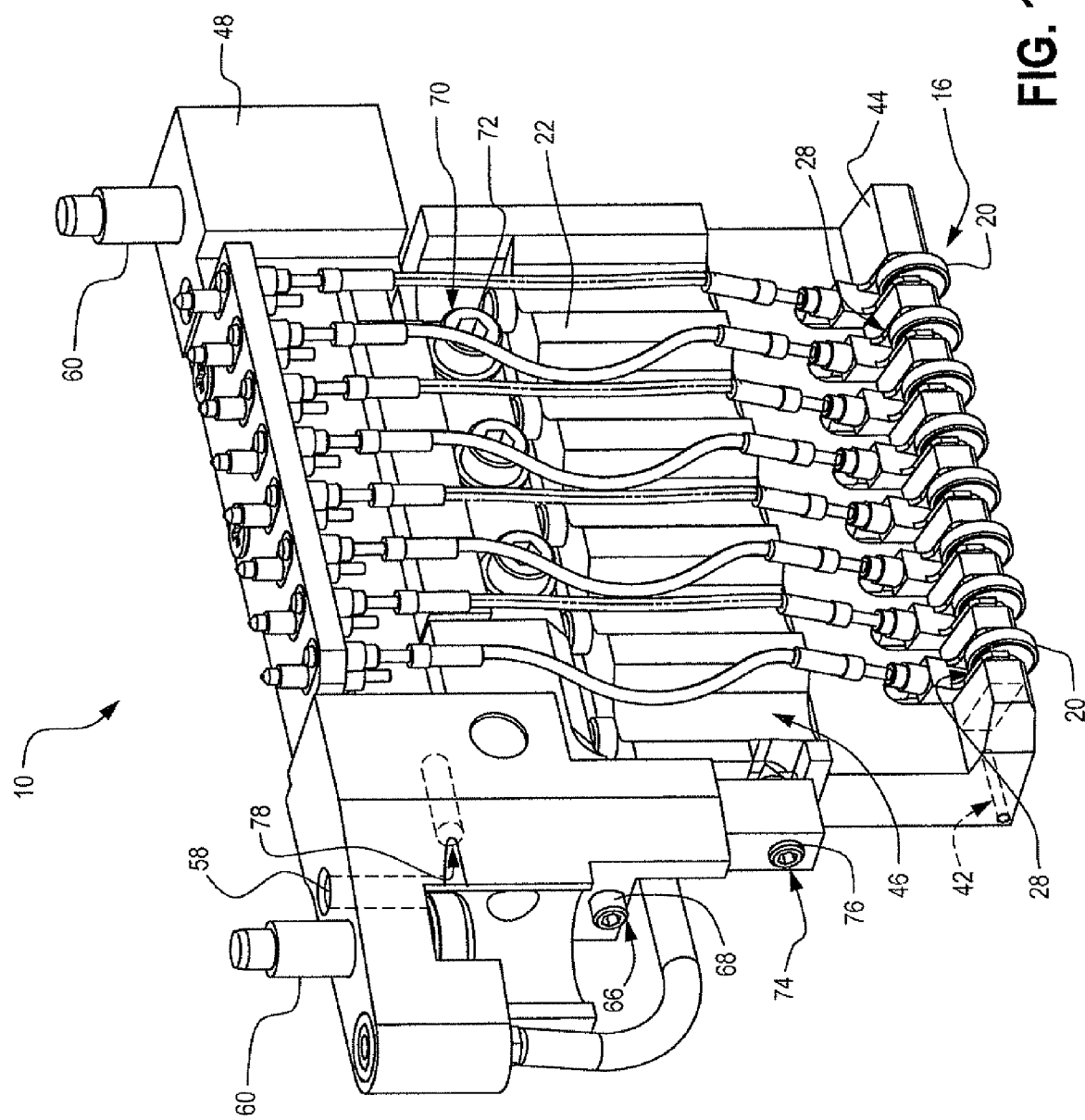
FIG. 1 is a simplified perspective view of an adjustable force electrical contactor according to one embodiment of the present invention.

Referring now to FIGS. 1-4, an apparatus 10 for testing electrical components 12 (schematically seen in FIG. 8) supported on a test plate 14 (also best seen in FIG. 8) for transport along a path travel through a test station 16 is illustrated. The adjustable force electrical contactor apparatus 10 includes an electrical contactor 20 located a test station 16 for contacting a surface 18 of the test plate 14 and at least one electrical component 12 transported to the test station 16 by the test plate 14 for testing. An adjustable force applicator 22 supplies contact pressure to the contactor 20. The applicator 22 is operably connected to the contactor 20 in order to supply a substantially constant force over a large working range of travel. It should be recognized that the electrical contactor 20 can be selected from a group of contactor tip styles consisting of a sliding contact, a large radius contact, a small radius contact, a micro roller, a standard roller, a sliding blade, a disk, or a wire. It should also be recognized that the adjustable force applicator can be selected from a group of applicator styles consisting of an air cylinder, a bladder cylinder, a pneumatic cylinder, an electroformed bellows, a voice coil motor, a solenoid, a piezoelectric actuator, and a muscle beam wire. The contactor style is selected depending on the device under test and the operating conditions of the test. The applicator style is selected to provide a force adjustable source depending on the available power source, i.e., pneumatic and/or electrical power availability, so that the force can be precisely adjusted to a degree greater than that previously available with spring loaded configurations.

Referring briefly to FIGS. 9-11B, a bracket 28 is illustrated in various styles for supporting the electrical contactor 20. The bracket 28 can have a pivot point or axis 30 adjacent one end 32, a signal connector 34 adjacent a central portion 36, and an electrical contactor mount 38 adjacent an opposite end 40. Referring again to FIG. 1, a tip holder housing 44 supports the bracket 28 by the pivot axis 30. A pivot point or pin receiving aperture 42 connects the bracket 28 to the tip holder housing 44 for rotational movement.

Figure 8:
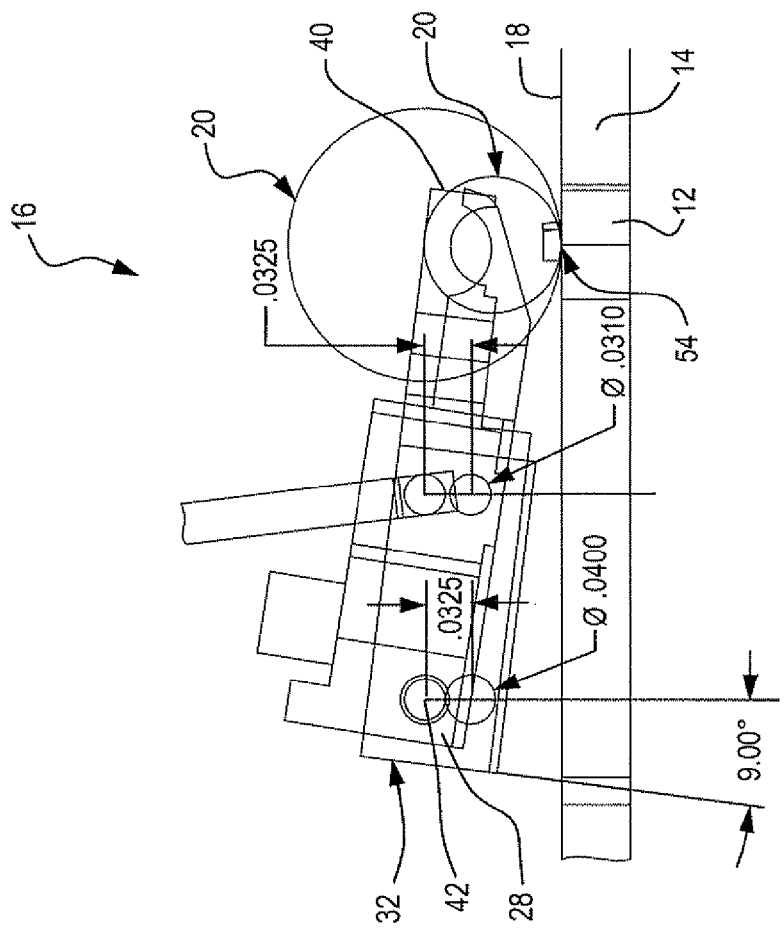
FIG. 8 is a schematic of a bracket according to one embodiment of the present invention illustrating a standard roller and a micro roller and the working contact point of the rollers with respect to the pivot axis of the bracket.

By way of example and not limitation, the illustrated configuration shown in FIGS. 1-4 will be described with respect to an adjustable force applicator 22 in the form of an air cylinder. As illustrated, the tip holder housing 44 is supported from the air cylinder housing 46, and the air cylinder housing 46 is supported from a mounting bar 48. A force applying pin 50 is operably associated with the adjustable force applicator 22 to apply force to a position 52 (best seen in FIG. 12) located on the bracket 28 between a working point 54 (best seen in FIG. 8) of the contactor 20 and the pivot pin 30 or aperture 42. This configuration allows the applied force variation to be reduced as a result of a lever reduction ratio between the working point 54 of the contactor 20 and the force applying position 52 as best seen in FIGS. 3, 8 and 12.

Figure 3:
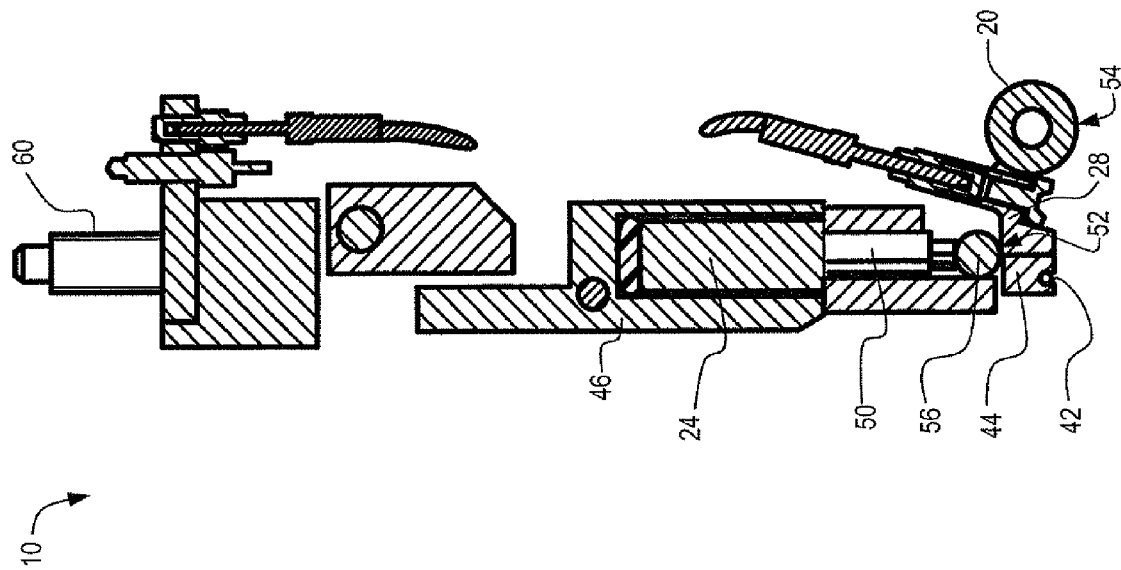
FIG. 3 is a cross sectional perspective view of the adjustable force electrical contactor taken as shown in FIG. 1.
Figure 2:
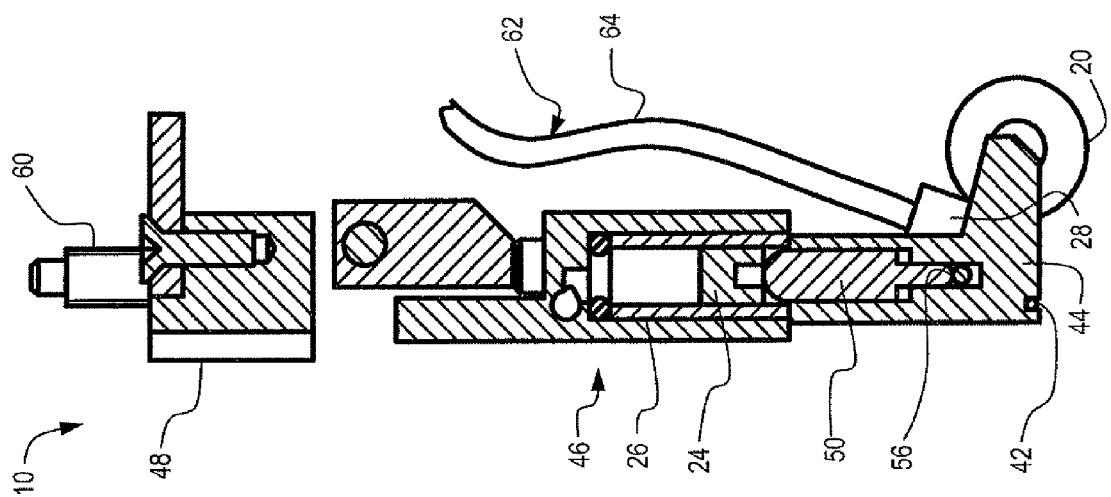
FIG. 2 is a cross sectional perspective view of the adjustable force electrical contactor taken as shown in FIG. 1.
Figure 4:
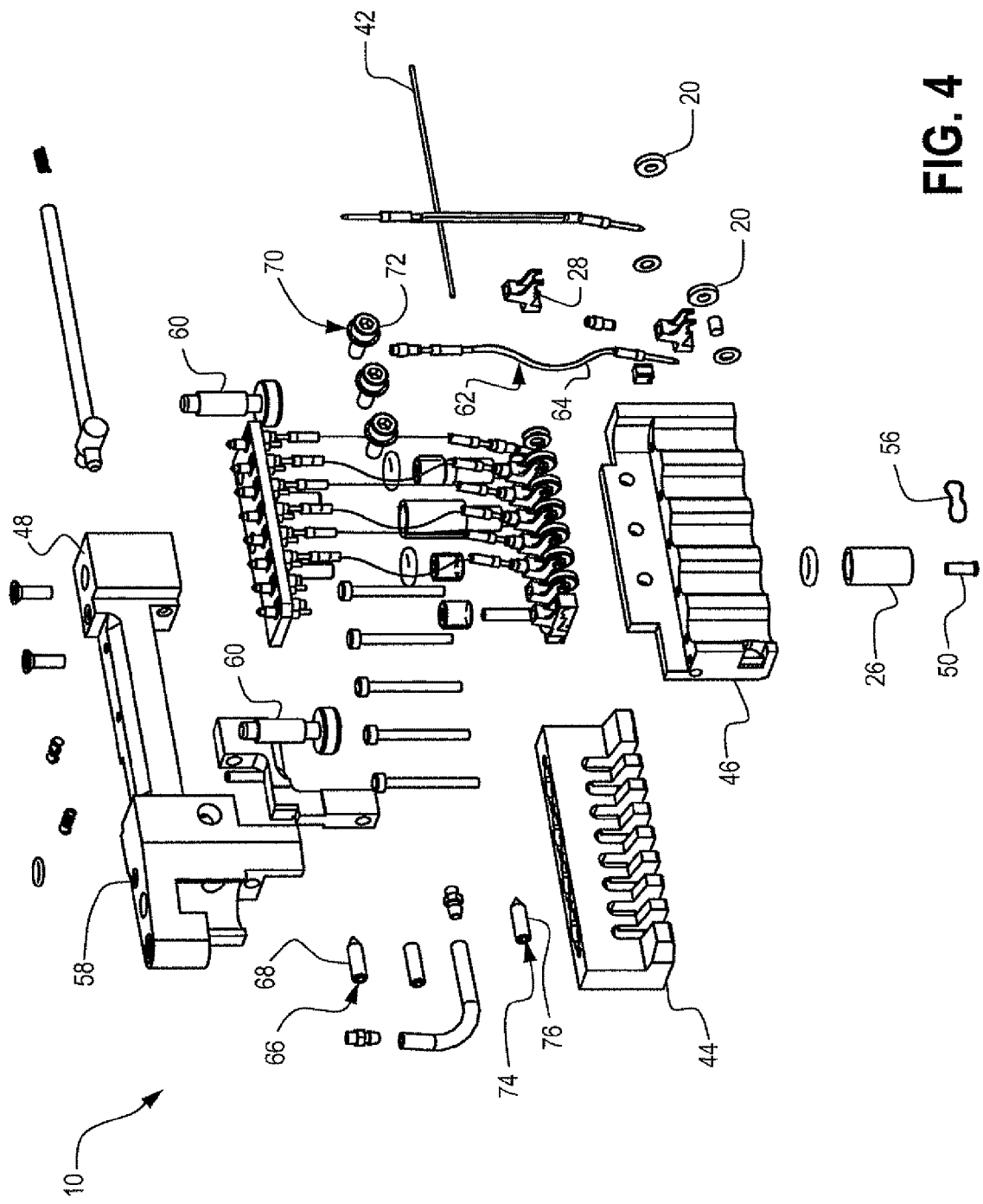
FIG. 4 is an exploded perspective view of the adjustable force electrical contactor of FIG. 1.
Figure 12:
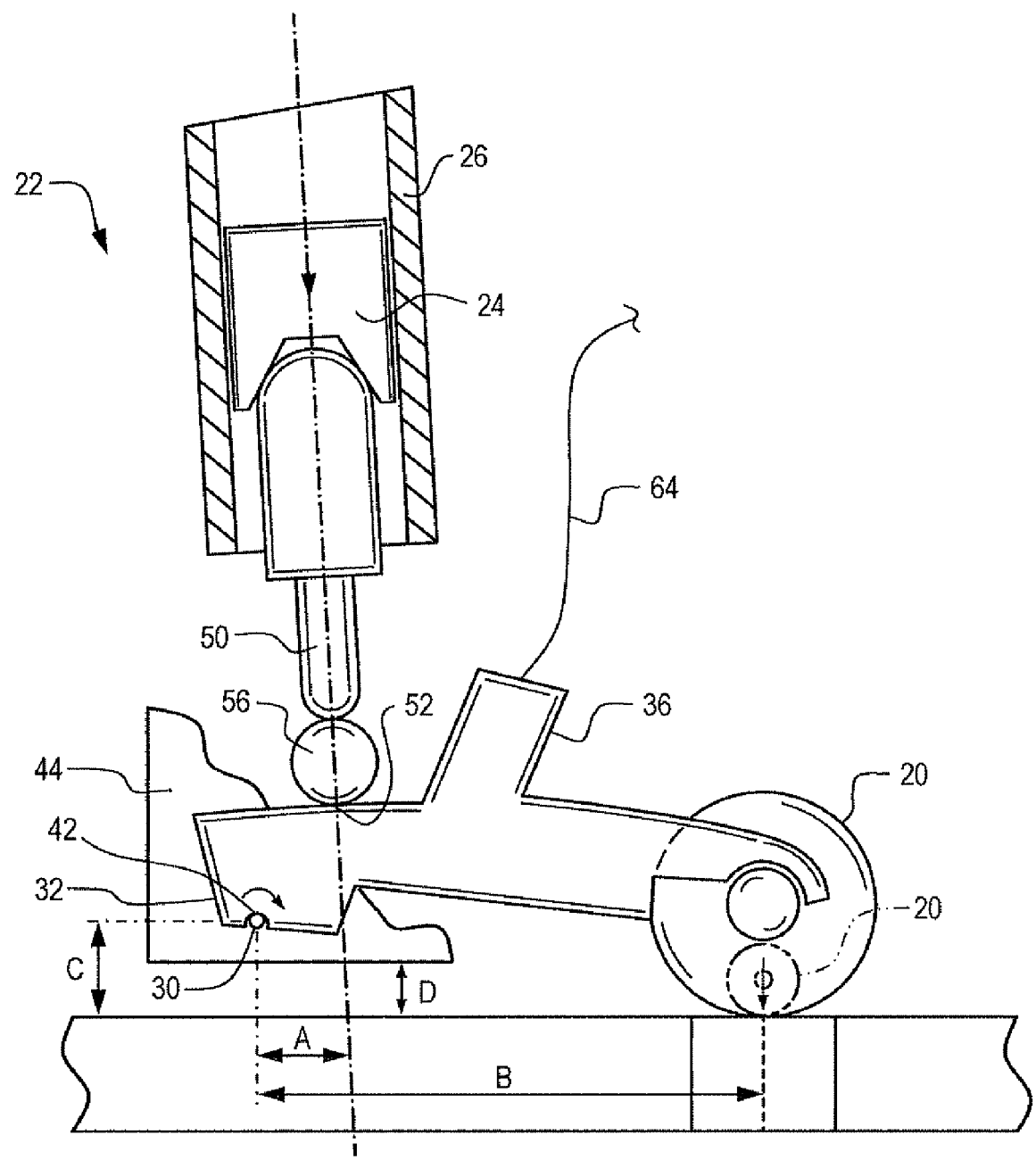
FIG. 12 is a simplified schematic view of an adjustable force electrical contactor according to an embodiment of the invention.

A link pin 56, as best seen in FIGS. 2, 3 and 12, can extend between at least two adjacent brackets or arms 28 and can be located between the force applying pin 50 and the bracket 28 for distributing force applied by the associated air cylinder force applicator 22 to at least two adjacent contactors 20. This allows a reduction in the number of air cylinders required, while still allowing precise adjustable force application with reduced applied force variation.

Figure 5:
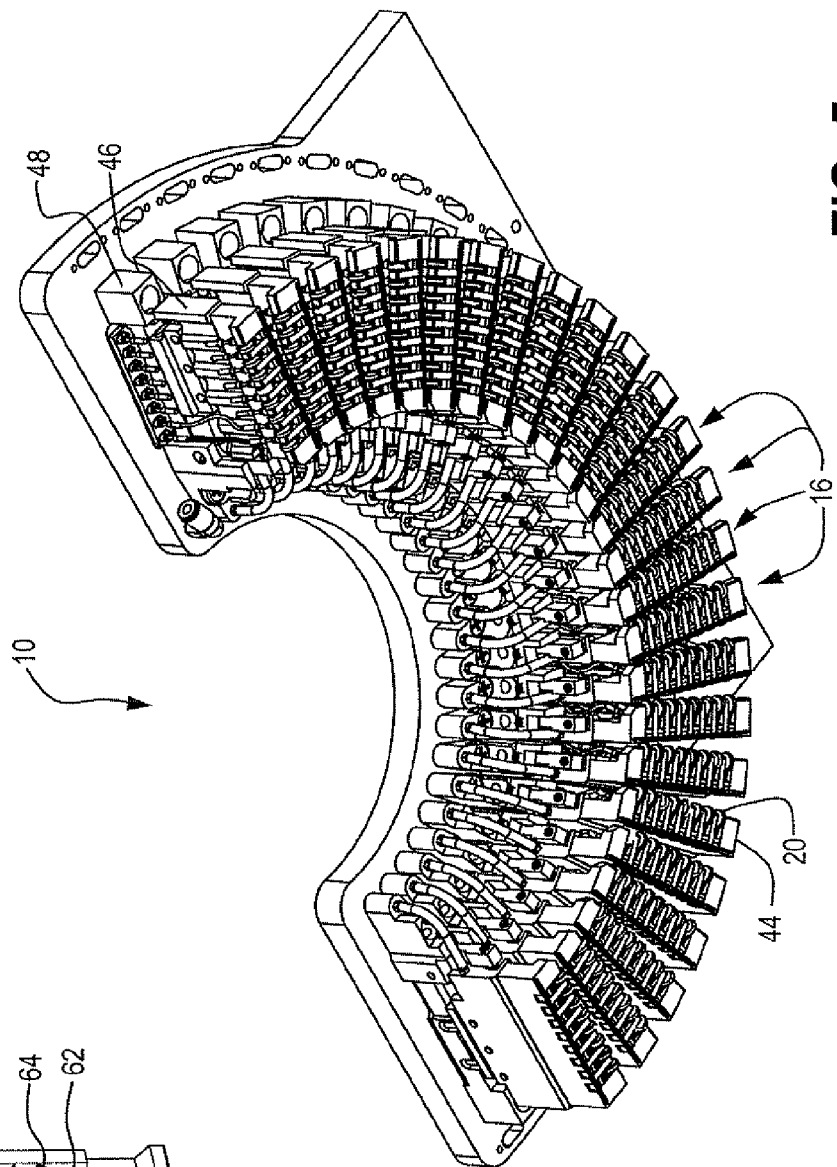
FIG. 5 is a bottom perspective view of a test station assembly including a plurality of adjustable force applicators and contactors according to one embodiment of the present invention.
Figure 6:
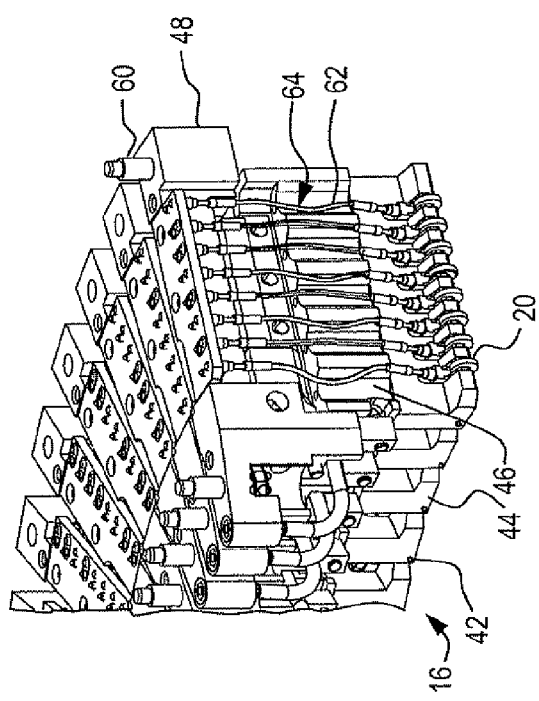
FIG. 6 is a top perspective view of a test station assembly including a plurality of adjustable force applicators and contactors of FIG. 5 with the upper plate removed.

The mounting bar 48 as thus seen in FIGS. 1-4 includes at least one locator aperture 58 and at least one mounting fastener 60 for engagement with a support plate (best seen in FIG. 5). As illustrated, a plurality of contactors 20 are supported from the tip holder housing 44 for pivoting movement about a common coaxial Y-axis pivot pin 30 and receiving aperture 42 of the bracket 28. A signal path 62 can extend external of the air cylinder housing 46 between the bracket 28 and the mounting bar 48. The signal path 62 shown includes a replaceable wire 64.

At least one adjustment point 66 is provided for positioning the contactor 20 in a direction corresponding to the Y-axis direction of pin 30. In the illustrated configuration best seen in FIG. 1, the adjustment point 66 includes a set screw 68 engaged between the mounting bar 48 and the air cylinder housing 46 in order to move the supported tip holder housing 44 along the Y-axis for adjustment of the Y-axis position of the supported contactors 20. At least one adjustment point 70 can be provided for positioning the contactors 20 in a direction corresponding to an X-axis perpendicular to the Y-axis. As best seen in FIG. 1, the adjustment point 70 can include one or more threaded fasteners 72 supporting the air cylinder housing 46 from the mounting bar 48. Slots (not shown) in the air cylinder housing 46 can be provided allowing X-axis adjustment of the contactors 20, since the contactors 20 are supported through the tip holder housing 44 and air cylinder housing 46 with respect to the mounting bar 48. At least one adjustment point 74 could be provided for positioning the contactors 20 in a direction corresponding to a Z-axis perpendicular to the X-axis and the Y-axis. The adjustment point 74 shown includes a set screw 76 engageable to adjust the air cylinder housing 46 with respect to the mounting bar 48 along the Z-axis. Z-axis adjustment can also be obtained by an adjustment point 74 including an adjustment screw 78 having a bevel tip for pushing or positioning the force applying pin 50 with respect to the bracket 28 and thereby rotating the bracket 28 and supported contactor 20 in rotation in the Z-axis direction.

Figure 7:
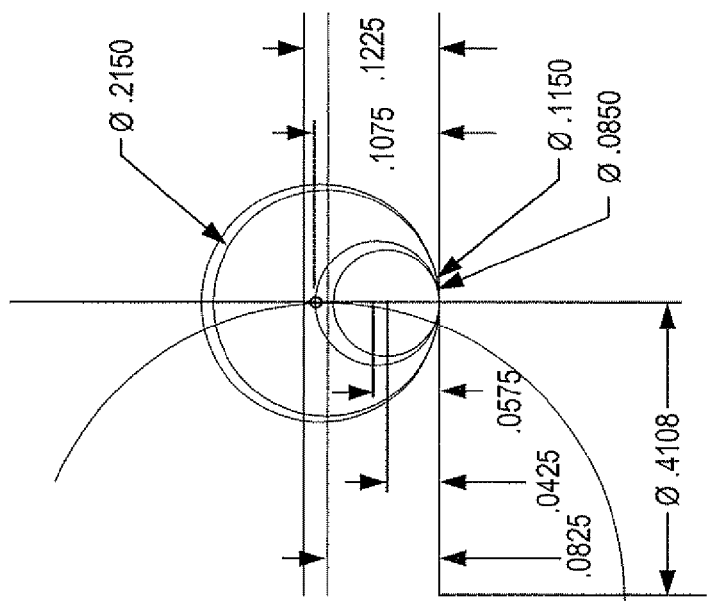
FIG. 7 is a schematic diagram illustrating a surface of a test plate with a standard roller diameter in a new condition and in a worn condition, a micro roller diameter in a new condition and a worn condition, and an arc indicating movement of the working point of the contactor about a pivot axis of a bracket.

Referring now to FIGS. 7 and 8, the common coaxial Y-axis 42 can be located centered between 0.1225 inches and 0.0425 inches, inclusive, above the surface 18 of the test plate 14. The common coaxial Y-axis pivot is preferably located at most 0.0825 inches above the surface 18 of the test plate 14. The common coaxial Y-axis pivot is more preferably located centered between 0.0825 inches and 0.0425 inches, inclusive, above the surface 18 of the test plate 14. The tip holder housing 33 is located at a position to provide clearance of at least 0.022 inches to 0.062 inches, and preferably about 0.062 inches, above the surface 18 of the test plate 14.

Referring now to FIGS. 11A and 11B, the contactor 20 can include a bracket 28 having a tip receiving aperture 80. An indexible tip contact 82 can have an X-shaped configuration, allowing the tip 82 to be repositioned into four separate orthogonal positions with respect to one another prior to requiring tip replacement. A fastener 84 releasably holds the indexible contact tip 82 in a fixed position with respect to the bracket 28. The indexible contact tip 82 can advantageously be formed of a copper tungsten carbide material, if desired.

Referring now to FIG. 12, an electrical contactor 20 according to one embodiment of the present invention uses a force-adjustable applicator 22 to supply contact pressure. The force-adjustable applicator 22 can apply force to each contactor 20 individually or can supply force to multiple contactors 20. The force can be precisely adjusted as desired for the particular device under test when in a ready position at the test station, and the force can be reduced to a lower setting during motion of the test plate to prevent damage to electronic components to be tested. Suitable adjustable force applicator devices include a dashpot air cylinder, a bladder cylinder, a pneumatic bladder, an electroformed bellows, a voice coil motor, a solenoid, a piezoelectric actuator, and a muscle wire beam. To set nominal contact force (pressure), the force output is determined by the air pressure supplied to the pneumatic source type, while electrical voltage and/or current levels are chosen in the case of electrical source devices. Since the adjustable force applicator 20 is separate from the contactor tip and signal path, fewer total contact types are needed to support a wide range of electrical test applications. By way of example and not limitation, by selecting and installing one of three interchangeable contact tips, only one contact module type is needed for all of the following typical test parameters: high contact pressure, high electrical power measurement, sliding contact tip; high contact pressure, low electrical power measurement, sliding contact tip; low contact pressure, high electrical power measurement, sliding contact tip; low contact pressure, low electrical power measurement, sliding contact tip; high contact pressure, high electrical power measurement, large radius rolling contact tip; high contact pressure, low electrical power measurement, large radius rolling contact tip; low contact pressure, high electrical power measurement, large radius rolling contact tip; low contact pressure, low electrical power measurement, large radius rolling contact tip; high contact pressure, high electrical power measurement, small radius contact tip; high contact pressure, low electrical power measurement, small radius contact tip; low contact pressure, high electrical power measurement, small radius contact tip; low contact pressure, low electrical power measurement, small radius contact tip. By allowing selection and installation of one of three interchangeable contact tips, production costs, operation costs, and complexity of the testing apparatus are reduced. The contact force can be automatically adjusted to optimize the measurements based on real-time measurement results data of the test system. A reduction in force variation can be accomplished by using a lever reduction ratio between the working point 54 of the contactor 20 and the force application position 52 of the adjustable force applicator 22. By way of example and not limitation, if the distance A from the pivot point 30, 42 of the contactor support bracket or arm 28 to the adjustable force application point 52 is 0.100 inches and the distance B from the pivot point 30, 42 to the working point 54 of the contact tip 20 is 1.000 inches, then the reduction ratio is 1:10. The force of the contact tip 20 will be $\frac{1}{10}^{th}$ of the adjustable force applicator output, but the advantage of the lever reduction is that the contact force variation will also only be $\frac{1}{10}^{th}$ of the variation of the adjustable force applicator source, allowing for even more precise contact force control.

Occasionally a test track will begin to perform poorly due to a contaminated, worn out or broken contact tip while the other test tracks continue to operate correctly. In this case it may be advantageous, from a throughput versus yield rate perspective, to disable the failing track. One embodiment of the present invention allows the optional operating mode of simply de-pressurizing or retracting individual or impaired contact tips so as not to occur any continued component wear. When combined with selective test track loading, the system yield can be greatly optimized until it can be taken down for repair for the failing test track or tracks.

Referring now to FIGS. 7, 8 and 12, the linkage assembly 50, 56, 28 between the adjustable force applicator source and the contact tip according to one embodiment of the present invention is designed to minimize or eliminate any change in the position of the working point 54 of contact tip 20 with respect to the device under test. The linkage provides a range of travel in order to compensate for normal wear of the working position of the contact tip surface. In one embodiment of the present invention, the pivot location 30, 42 of the bracket 28 supporting the contact tip 20 has been located at a dimension C in order to minimize longitudinal shift in the contact tip position along the path of travel for the electronic components to be tested. The dimension C can be between approximately 0.1225 inches and approximately 0.0425 inches, inclusive, above the surface 18 of the test plate 14. The dimension C is preferably located at most approximately 0.0825 inches above the surface 18 of the test plate 14. The dimension C is more preferably located between approximately 0.0825 inches and approximately 0.0425 inches, inclusive, above the surface 18 of the test plate 14. This is sometime referred to as axis shift control. The contact design is not sensitive to small dimensional variations due to normal wear of the components, or the like. The contact force does not change, and the contact tip position does not change, or only changes very slightly, due to normal wear. This configuration makes construction and operation of the apparatus less sensitive to variations due to the following variables: co-planarity error between the contact mount and the vacuum ring; flatness error of the vacuum ring; and/or variation of the contact tip geometry due to: initial size variation of an outside diameter of the roller, inside diameter of the roller, or axle diameter. This feature can result in a reduction in the time to setup and test the system, since it greatly reduces the effort needed to achieve contact tip dimension or height co-planarity. A reduction in the normal operating set-up time can also be realized, as the need for periodic recalibrating of the system is reduced or eliminated. The dimension D between the bottom of the tip holder housing 44 and the surface 18 of the test plate 14 can be between approximately 0.022 inches and approximately 0.062 inches, inclusive. The dimension D is preferably at most approximately 0.062 inches above the surface 18 of the test plate 14.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. In an apparatus for testing electronic components supported in pockets of a test plate for transport along a path of travel through a test station, the improvement comprising:
   an electrical contactor located at a test station for contacting a surface of the test plate and at least one of the electronic components transported to the test station by the test plate for testing; and
   an adjustable force applicator for supplying contact pressure to the contactor, the applicator connected to the contactor such that the contactor applies a substantially constant force to those of the electronic components in line with the contactor and to portions of the surface of the test plate therebetween during transport along the path of travel.

2. The improvement of claim 1, wherein the electrical contactor is a sliding contact, a large radius contact, a small radius contact, a micro-roller, a standard roller, a sliding blade, a disk or a wire.

3. The improvement of claim 1, wherein the adjustable force applicator is an air cylinder, a bladder cylinder, a pneumatic bladder, an electro-formed bellows, a voice coil motor, a solenoid, a piezoelectric actuator or a muscle wire beam.

4. The improvement of claim 1 further comprising:
   a bracket for supporting the electrical contactor and extending along the path of travel from a first end to a second end, the bracket having a pivot point adjacent the first end, a signal connector adjacent a central portion and extending in a direction away from the test plate, and an electrical contactor mount adjacent the second end.

5. The improvement of claim 1 further comprising:
   a mounting bar having at least one locator aperture and at least one mounting fastener;
   an air cylinder housing supported by the mounting bar;
   a tip holder supported by the air cylinder housing; and
   a plurality of contactor tips supported by the tip holder for pivoting movement about a common coaxial Y-axis pivot.

6. The improvement of claim 5 further comprising:
   at least one adjustment point for positioning the plurality of contactors in a direction corresponding to the Y-axis.

7. The improvement of claim 5 further comprising:
   at least one adjustment point for positioning the plurality of contactors in a direction corresponding to an X-axis perpendicular to the Y-axis.

8. The improvement of claim 5 further comprising:
   at least one adjustment point for positioning the plurality of contactors in a direction corresponding to a Z-axis perpendicular to an X-axis perpendicular to the Y-axis and the Y-axis.

9. The improvement of claim 5 further comprising:
   a bracket for supporting the electrical contactor, the bracket having a pivot point adjacent one end, a signal connector adjacent a central portion, and an electrical contactor mount adjacent an opposite end; and
   a signal path external of the air cylinder housing and extending between the bracket and the mounting bar.

10. The improvement of claim 9, wherein the signal path is a replaceable wire.

11. The improvement of claim 5, wherein the common coaxial Y-axis pivot is located between 0.1225 inches and 0.0425 inches, inclusive, above the surface of the test plate.

12. The improvement of claim 5, wherein the common coaxial Y-axis pivot is located at most 0.0825 inches above the surface of the test plate.

13. The improvement of claim 5, wherein the common coaxial Y-axis pivot is located between 0.0825 inches and 0.0425 inches, inclusive, above the surface of the test plate.

14. The improvement of claim 5, wherein the tip holder is located to allow clearance of between at least 0.022 inches and 0.062 inches, inclusive, above the surface of the test plate.

15. The improvement of claim 1, wherein the contactor further comprises:
   a bracket having a tip-receiving aperture;
   an indexable contact tip having an X-shaped configuration allowing the tip to be repositioned into four separate orthogonal positions with respect to one another prior to requiring tip replacement; and
   a fastener for releasably holding the indexable contact tip in a fixed position with respect to the bracket.

16. The improvement of claim 15, wherein the indexable contact tip is formed of copper tungsten carbide.

17. In an apparatus for testing electronic components supported on a test plate for transport along a path of travel through a test station, the improvement comprising:
   an electrical contactor located at a test station for contacting a surface of the test plate and at least one electronic component transported to the test station by the test plate for testing;
   an adjustable force applicator for supplying contact pressure to the contactor, the applicator connected to the contactor in order to apply a substantially constant force over a large working range of travel;
   a bracket for supporting the electrical contactor, the bracket having a pivot point adjacent one end, a signal connector adjacent a central portion, and an electrical contactor mount adjacent an opposite end;
   a tip holder housing;
   a contactor pivot point for connecting the bracket to the tip holder housing for rotational movement; and
   the adjustable force applicator including an air cylinder having a force applying pin connected to apply force to a position located between a working point of the contactor and the pivot point, such that the applied force variation is reduced as a result of a lever reduction ratio between the working point of the contactor and the force applying pin position.

18. The improvement of claim 17 wherein the bracket is one of a plurality of brackets and further comprising:

a link pin extending between at least the bracket and an adjacent bracket and located between a respective force applying pin and each bracket for distributing force applied by the associated air cylinder to the electrical contactor and an adjacent electrical contactor supported by the adjacent bracket.

19. An apparatus for testing electronic components supported on a test plate for transport along a path of travel through a test station comprising:

an electrical contactor located at a test station for contacting a surface of a test plate and at least one electronic component transported to the test station by the test plate for testing;

an adjustable force applicator for supplying contact pressure to the contactor, the applicator configured to apply a substantially constant force to the contactor over a large working range of travel and including an air cylinder having a force applying pin connected to apply force to a position located between a working point of the contactor and the pivot point such that the applied force variation is reduced as a result of a lever reduction ratio between the working point and the force applying pin position; and a bracket for supporting the electrical contactor, the bracket having a pivot point adjacent one end, a signal connector adjacent a central portion, and an electrical contactor mount adjacent an opposite end, and wherein the pivot point is located between 0.0825 inches and 0.0425 inches, inclusive, above the test plate.

20. The apparatus of claim 19 further comprising:

a mounting bar having at least one locator aperture and at least one mounting fastener;

an air cylinder housing supported by the mounting bar, the air cylinder housing including a glass cylinder and a carbon graphite piston;

a tip holder supported by the air cylinder housing, the bracket supported by the tip holder for pivoting movement about a Y-axis pivot;

at least one adjustment point for positioning the bracket in a direction corresponding to the Y-axis;

at least one adjustment point for positioning the bracket in a direction corresponding to an X-axis perpendicular to the Y-axis; and at least one adjustment point for positioning the bracket in a direction corresponding to a Z-axis perpendicular to the X-axis and the Y-axis.

\* \* \* \* \*